(12) United States Patent
Yang et al.

(10) Patent No.: US 11,011,462 B2
(45) Date of Patent: May 18, 2021

(54) METHOD FOR FORMING FUSE PAD AND BOND PAD OF INTEGRATED CIRCUIT

(71) Applicant: Taiwan Semiconductor Manufacturing Co., Ltd., Hsin-Chu (TW)

(72) Inventors: Tai-I Yang, Hsinchu (TW); Chun-Yi Yang, Hsinchu (TW); Chih-Hao Lin, Hsinchu (TW); Hong-Seng Shue, Zhubei (TW); Ruei-Hung Jang, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 83 days.

(21) Appl. No.: 15/350,372

(22) Filed: Nov. 14, 2016

(65) Prior Publication Data

US 2017/0062334 A1    Mar. 2, 2017

Related U.S. Application Data

(62) Division of application No. 13/531,743, filed on Jun. 25, 2012, now Pat. No. 9,496,221.

(51) Int. Cl.
*H01L 23/62* (2006.01)
*H01L 23/525* (2006.01)
*H01L 23/00* (2006.01)

(52) U.S. Cl.
CPC ...... *H01L 23/5256* (2013.01); *H01L 23/5258* (2013.01); *H01L 23/62* (2013.01); *H01L 24/05* (2013.01); *H01L 24/45* (2013.01); *H01L 2224/04042* (2013.01);

(Continued)

(58) Field of Classification Search
CPC ..... H01L 23/5256; H01L 24/05; H01L 23/62; H01L 2224/04042; H01L 2224/022; H01L 2224/0225; H01L 2224/0391; H01L 2224/2791; H01L 2224/02206;

(Continued)

(56) References Cited

U.S. PATENT DOCUMENTS

| 5,312,768 | A |   | 5/1994  | Gonzalez |            |
|-----------|---|---|---------|----------|------------|
| 5,844,295 | A | * | 12/1998 | Tsukude  | H01L 23/485 |
|           |   |   |         |          | 257/529    |
| 5,985,765 | A |   | 11/1999 | Hsiao et al. |        |

(Continued)

OTHER PUBLICATIONS

Non-Final Office Action dated Aug. 15, 2014 for U.S. Appl. No. 13/531,743.

(Continued)

*Primary Examiner* — Monica D Harrison
*Assistant Examiner* — John Lin
(74) *Attorney, Agent, or Firm* — Eschweiler & Potashnik, LLC

(57) ABSTRACT

The present disclosure relates to a semiconductor device. A fuse layer is arranged within a first dielectric layer. A bond pad is arranged on the first dielectric layer. A second dielectric layer is arranged along sidewall and upper surfaces of the bond pad. A passivation layer is arranged over the first and second dielectric layers, and the passivation layer having a bond pad opening overlying the bond pad and a fuse opening overlying the fuse layer. The bond pad has a bottom surface that is co-planar with a bottom surface of the passivation layer.

11 Claims, 10 Drawing Sheets

(52) U.S. Cl.
CPC ............... *H01L 2224/05571* (2013.01); *H01L 2924/0002* (2013.01); *H01L 2924/00014* (2013.01)

(58) Field of Classification Search
CPC ............. H01L 2224/0221; H01L 24/45; H01L 2224/05571; H02L 2224/04042
See application file for complete search history.

(56) References Cited

U.S. PATENT DOCUMENTS

| | | | |
|---|---|---|---|
| 6,235,557 B1 | 5/2001 | Manley | |
| 6,316,350 B1 | 11/2001 | Eissa et al. | |
| 6,677,226 B1 | 1/2004 | Bowen et al. | |
| 6,911,386 B1* | 6/2005 | Lee | H01L 23/5258 257/E23.15 |
| 7,265,001 B2 | 9/2007 | Lee | |
| 2003/0199159 A1* | 10/2003 | Fan | H01L 24/11 438/612 |
| 2004/0266077 A1 | 12/2004 | Yeo et al. | |
| 2005/0142834 A1* | 6/2005 | Lee | H01L 23/5258 438/601 |
| 2008/0088038 A1* | 4/2008 | Hsu | H01L 24/05 257/786 |
| 2008/0246113 A1* | 10/2008 | Baek | H01L 24/02 257/529 |

OTHER PUBLICATIONS

Final Office Action dated Mar. 4, 2015 for U.S. Appl. No. 13/531,743.
Non-Final Office Action dated Jun. 19, 2015 for U.S. Appl. No. 13/531,743.
Final Office Action dated Dec. 17, 2015 for U.S. Appl. No. 13/531,743.
Final Office Action dated Apr. 18, 2016 for U.S. Appl. No. 13/531,743.
Notice of Allowance dated Jul. 14, 2016 for U.S. Appl. No. 13/531,743.

* cited by examiner

METHOD FOR FORMING FUSE PAD AND BOND PAD OF INTEGRATED CIRCUIT

REFERENCE TO RELATED APPLICATION

This Application is a Divisional of U.S. application Ser. No. 13/531,743 filed on Jun. 25, 2012, the contents of which his hereby incorporated by reference in its entirety.

BACKGROUND

Semiconductor device fabrication is a process used to create integrated circuits that are present in everyday electrical and electronic devices. The fabrication process is a multiple-step sequence of photolithographic and chemical processing steps during which electronic circuits are gradually created on a wafer composed of a semiconducting material.

The various processing steps fall into a number of categories including deposition, removal, patterning, and modification of electrical properties (i.e., doping). Deposition is any process that grows, coats, or otherwise transfers a material onto the wafer. Some examples of deposition processes include physical vapor deposition (PVD), chemical vapor deposition (CVD), electrochemical deposition (ECD), molecular beam epitaxy (MBE) and atomic layer deposition (ALD). Removal processes are any that remove material from the wafer either in bulk or selectively and consist primarily of etch processes, either wet etching or dry etching. Chemical-mechanical planarization (CMP) is also a removal process used between levels.

Patterning is series of processes that shape or alter the existing shape of the deposited materials and is also referred to as lithography. In one example, a wafer is coated with a chemical called a photoresist. The photoresist is exposed by exposing select portions of the wafer to short wavelength light. The unexposed regions are washed away by a developer solution. After etching or other processing, the remaining photoresist is removed.

DETAILED DESCRIPTION

Figure 1A:
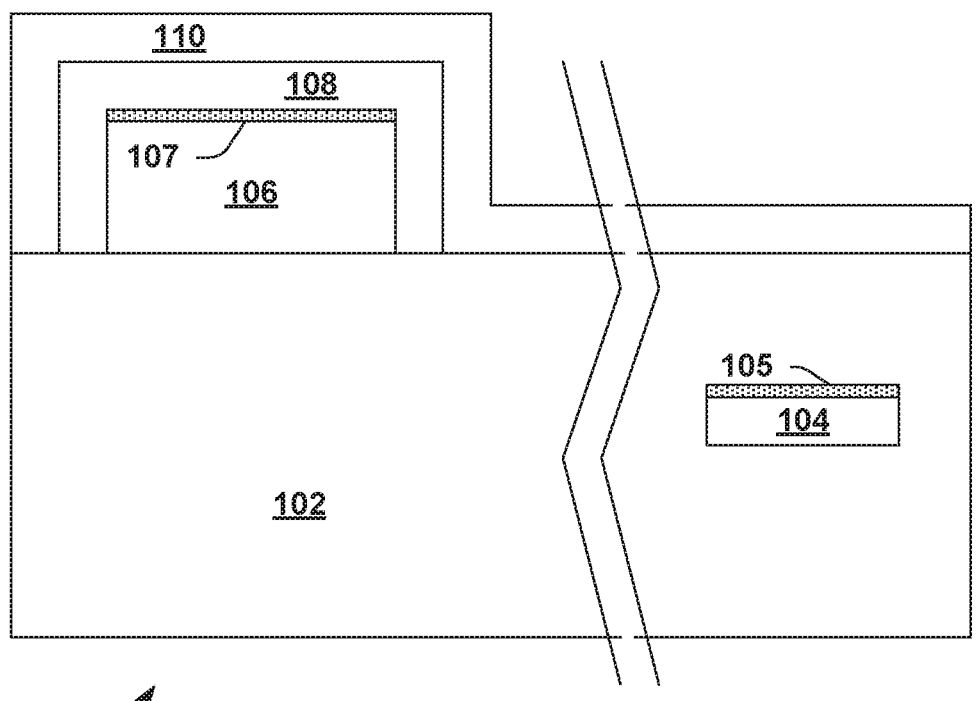
FIG. 1A is a cross sectional view of a semiconductor device at a stage of fabrication to illustrate bond pad exposure and fuse window formation.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Semiconductor fuses and bond pads are important components in many integrated circuits. The fuses are utilized to protect against over-current conditions and can limit short circuit current. Fuses mitigate damage due to current overload and short circuit conditions. Bonds or bond pads are located on the device and provide electrical connections to the circuits and devices formed therein. Bond pads are typically flat, large, metallic regions that are connected to package leads by way of bond wires or other connectors.

The fuses are bond pads are formed by a number of fabrication processes. In one example, they are fabricating using multiple masks. Masks are used in patterning process to define material to be removed. Using multiple masks requires added fabrication steps, which can slow down the fabrication process and/or increase cost and complexity.

Fuse etching is a process used to define the fuse window, such as for laser trim products. The fuse window and bond pad have different dielectric thicknesses to be defined. After a passivation etching process, the bond pad is clean on the surface of the metal, but the fuse window has a remaining portion of dielectric material. The passivation etching process removes passivation layers, such as anti reflective coatings (ARC), including materials such as Titanium-Nitride.

A first technique to obtain a fuse window and an exposed upper surface of the bond pad uses is to use two masks to perform separate etch processes for the bond pad and the fuse window. A second technique is to use a passivation layer, on the bond pad to obtain high selectivity for the bond pad and the remaining oxide of the fuse window. Then, a plasma treatment is utilized to remove the Titanium nitride on the bond pad. An example of the first technique, using two masks to define the bond pad and the fuse window, is described below in FIGS. 1A to 1F. An example of the second technique, using a selective etch process followed by a plasma treatment, is described below in FIGS. 2A to 2E.

FIG. 1A is a cross sectional view of a semiconductor device 100 at a stage of fabrication to illustrate bond pad exposure and fuse window formation. The device 100 is provided for illustrative purposes in order to facilitate an understanding of the disclosure. The semiconductor device 100 includes an oxide layer 102, a bond pad 106, and a fuse layer 104. The semiconductor device 100 requires removal of oxide and coatings from the bond pad 106 while maintaining a thickness of oxide above the fuse layer 104. The remaining thickness above the fuse layer 104 is also referred to as a fuse window.

The bond pad 106 is formed of a suitable conductive material, such as Al—Cu, Al—Si—Cu, metal, and the like. A coating 107, such as Titanium Nitride, is formed on an upper surface of the bond pad 106. The fuse layer 104 is also comprised of a suitable conductive material. Further, the fuse layer 104 also includes an anti reflective coating (ARC) 105 formed on an upper surface of the fuse layer.

An oxide layer 102 has been formed over and around the fuse layer 104 and the bond pad 106 is located over the oxide layer 102. Oxide is deposited or formed over the device 100 and forms a deposited oxide layer 108. A suitable oxide deposition or formation process can be utilized. A silicon nitride layer 110 is deposited or formed over the deposited oxide layer 108.

Figure 1B:
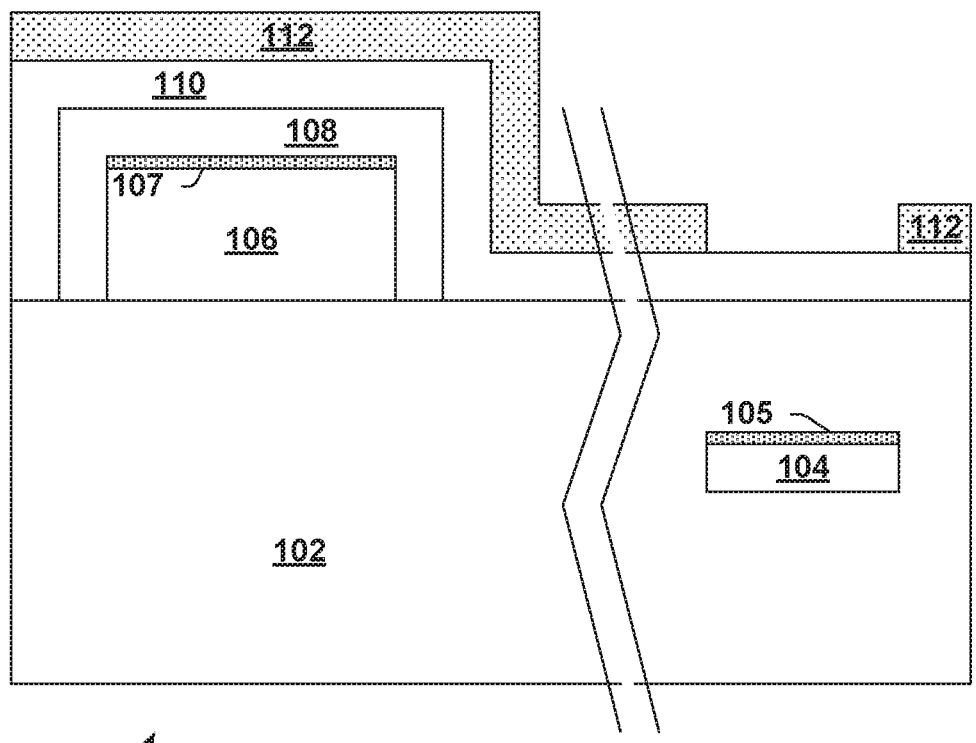
FIG. 1B is another cross sectional view of a semiconductor device at a stage of fabrication to illustrate bond pad exposure and fuse window formation.

FIG. 1B is another cross sectional view of a semiconductor device 100 at a stage of fabrication to illustrate bond pad exposure and fuse window formation. A layer of photoresist 112 is coated or deposited over the device 100. The layer of photoresist 112 is also referred to as a fuse resist layer. The photoresist 112 is exposed using a fuse mask or photomask and then developed. Once developed, a portion of the photoresist 112 above the fuse layer 104 is removed.

Figure 1C:
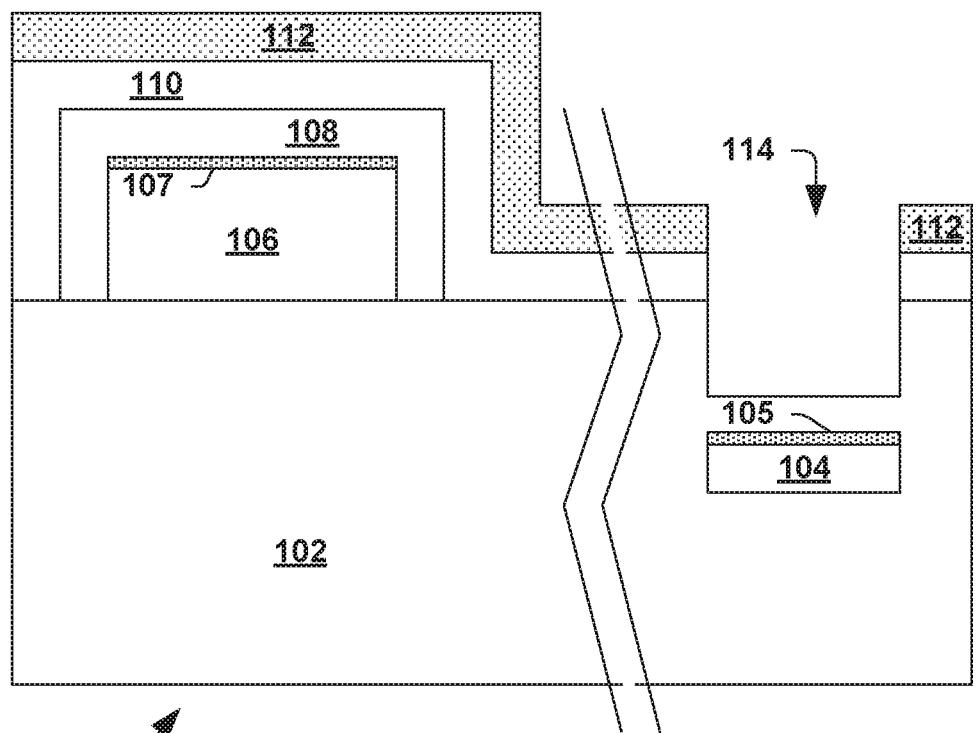
FIG. 1C is another cross sectional view of the semiconductor device at a stage of fabrication to illustrate bond pad exposure and fuse window formation.

FIG. 1C is another cross sectional view of the semiconductor device 100 at a stage of fabrication to illustrate bond pad exposure and fuse window formation. A fuse area etching process is performed that removes a portion of the oxide layer 102 above the fuse layer 104. An amount or thickness of the oxide layer 102 remains over the fuse layer and is referred to as the fuse window. However, it is noted that multiple layers and materials remain on the bond pad 106. After the fuse etching process is complete, the photoresist layer 112 is removed.

Figure 1D:
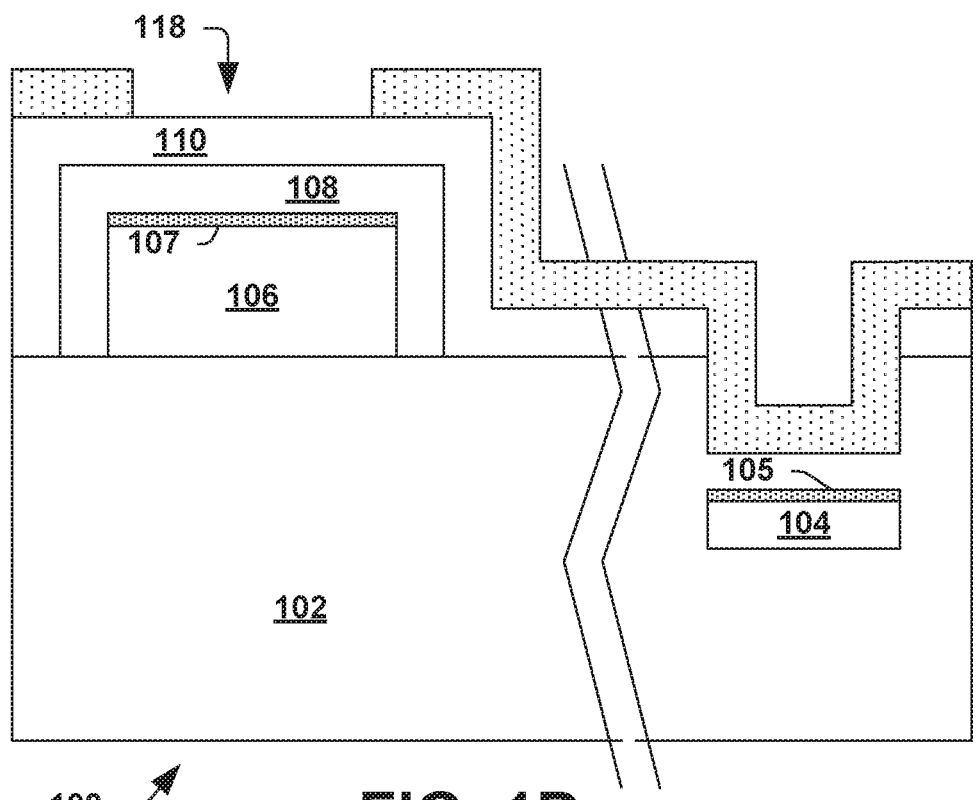
FIG. 1D is yet another cross sectional view of the semiconductor device at a stage of fabrication to illustrate bond pad exposure and fuse window formation.

FIG. 1D is yet another cross sectional view of the semiconductor device 100 at a stage of fabrication to illustrate bond pad exposure and fuse window formation. It can be seen that the photoresist layer 112 is no longer present. However, a second layer of photoresist 116 is coated or deposited over the device 100. The second layer of photoresist 116 is also referred to as a bond pad resist layer. The photoresist 116 is exposed and developed to create a bond mask. Once developed, a portion of the photoresist 116 above the bond pad 106 is removed.

Figure 1E:
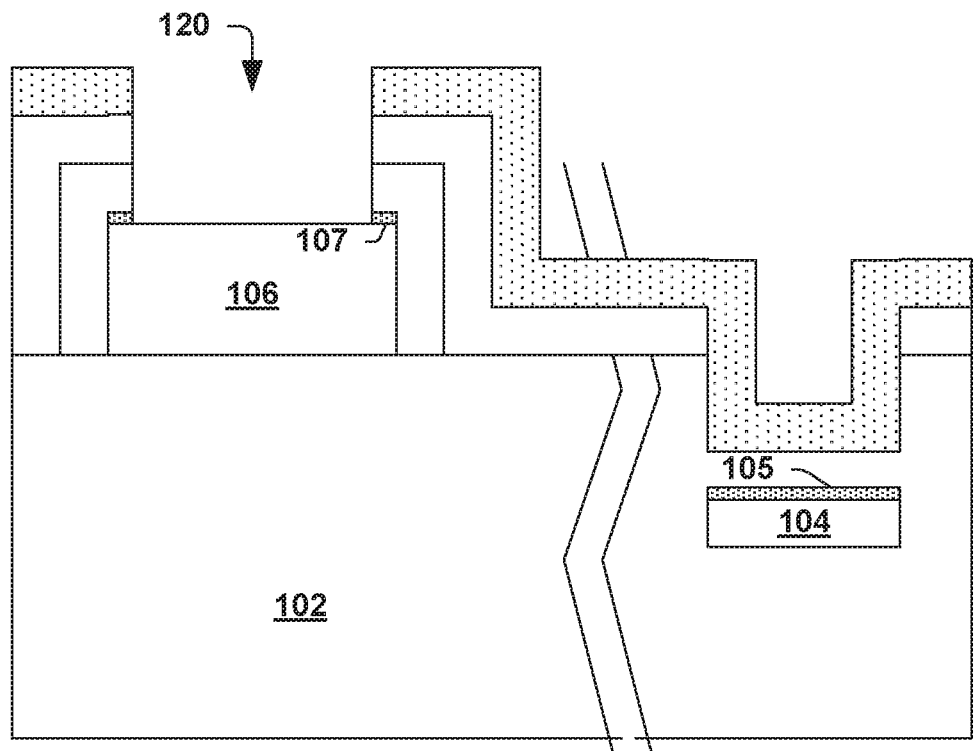
FIG. 1E is another cross sectional view of the semiconductor device at a stage of fabrication to illustrate bond pad exposure and fuse window formation.

FIG. 1E is another cross sectional view of the semiconductor device 100 at a stage of fabrication to illustrate bond pad exposure and fuse window formation. A bond area etching process is performed that removes a portion of the passivation layer 110 and a portion of the deposited oxide layer 108, both above the bond pad 106. The bond area etching process removes some, but not all, of the coating 107.

Figure 1F:
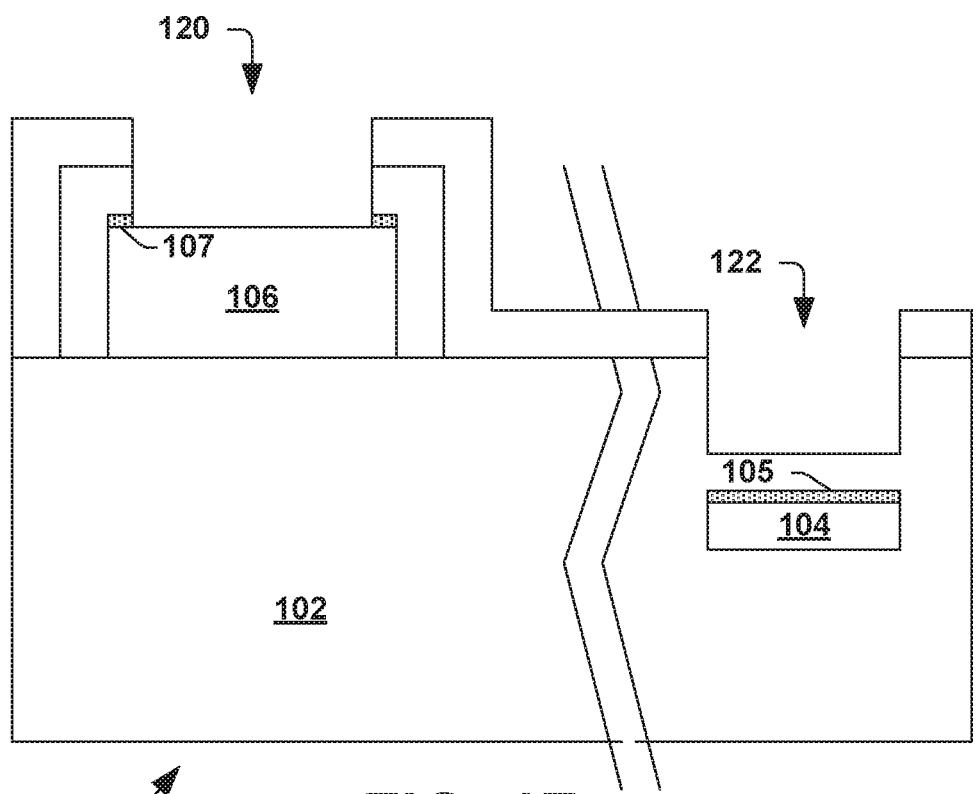
FIG. 1F is yet another cross sectional view of the semiconductor device at a stage of fabrication to illustrate bond pad exposure and fuse window formation.

FIG. 1F is yet another cross sectional view of the semiconductor device 100 at a stage of fabrication to illustrate bond pad exposure and fuse window formation. The second layer of photoresist 116 is removed. It is noted that portions of the coating 107 remain and are referred to as coating residue.

As a result, the device 100 is fabricated with the fuse window and an exposed upper layer of the bond pad 106. The use of multiple patterning processes permits control of the remaining oxide above the fuse layer 104. However, it is noted that multiple photoresist layers, masks, and etching processes, which are costly and time consuming to perform, are required in order to fabricate the semiconductor device 100. Other formation processes, including device packaging, connection of leads, and the like can also be performed.

Figure 2A:
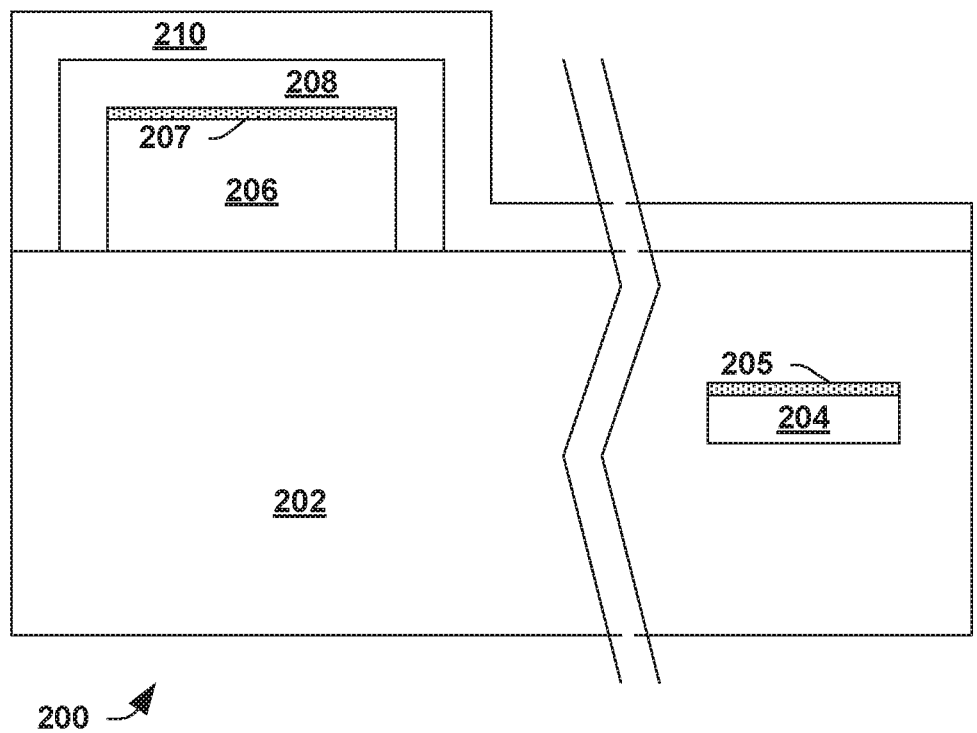
FIG. 2A is a cross sectional view of a semiconductor device at a stage of fabrication to illustrate bond pad exposure and fuse window formation.

FIG. 2A is a cross sectional view of a semiconductor device 200 at a stage of fabrication to illustrate bond pad exposure and fuse window formation. The device 200 is provided for illustrative purposes in order to facilitate an understanding of the invention. The semiconductor device 200 includes an oxide layer 202, a bond pad 206, and a fuse layer 204. The semiconductor device 200 requires removal of oxide and coatings from the bond pad 206 while maintaining a thickness of oxide above the fuse layer 204. The remaining thickness above the fuse layer 204 is also referred to as a fuse window.

The device 200 is to be formed using the second technique that uses a passivation layer, on the bond pad to obtain high selectivity for the bond pad and the remaining oxide of the fuse window. Then, a plasma treatment is utilized to remove the passivation layer from the bond pad. However, the plasma treatment removes an undesired amount of dielectric material from above the fuse layer.

The bond pad 206 is formed of a suitable conductive material, such as Al—Cu, Al—Si—Cu, metal, and the like. A coating 207 is formed on an upper surface of the bond pad 206. The fuse layer 204 is also comprised of a suitable conductive material. Additionally, the fuse layer 204 also includes an anti reflective coating (ARC) 205 formed on an upper surface of the fuse layer.

An oxide layer 202 has been formed over and around the fuse layer 204 and the bond pad 206 is located over the oxide layer 202. Oxide is deposited or formed over the device 200 and forms a deposited oxide layer 208. A suitable oxide deposition or formation process can be utilized. A passivation layer 210 is then deposited or formed over the deposited oxide layer 208. In one example, the passivation layer 210 includes a nitride material.

Figure 2B:
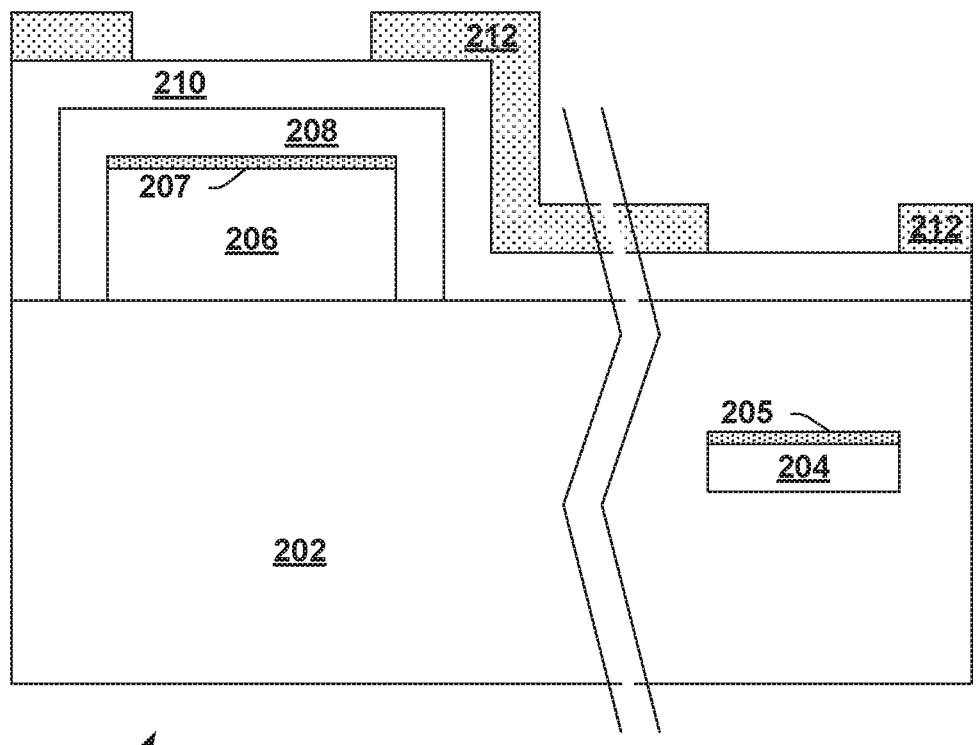
FIG. 2B is another cross sectional view of the semiconductor device at a stage of fabrication.

FIG. 2B is another cross sectional view of the semiconductor device 200 at a stage of fabrication. The view is provided to illustrate bond pad exposure and fuse window formation. A layer of photoresist 212 is coated or deposited over the device 200. The photoresist 212 is exposed using a mask or photomask and then developed. Once developed, a portion of the photoresist 212 above the fuse layer 204 and the bond pad 206 is removed.

Figure 2C:
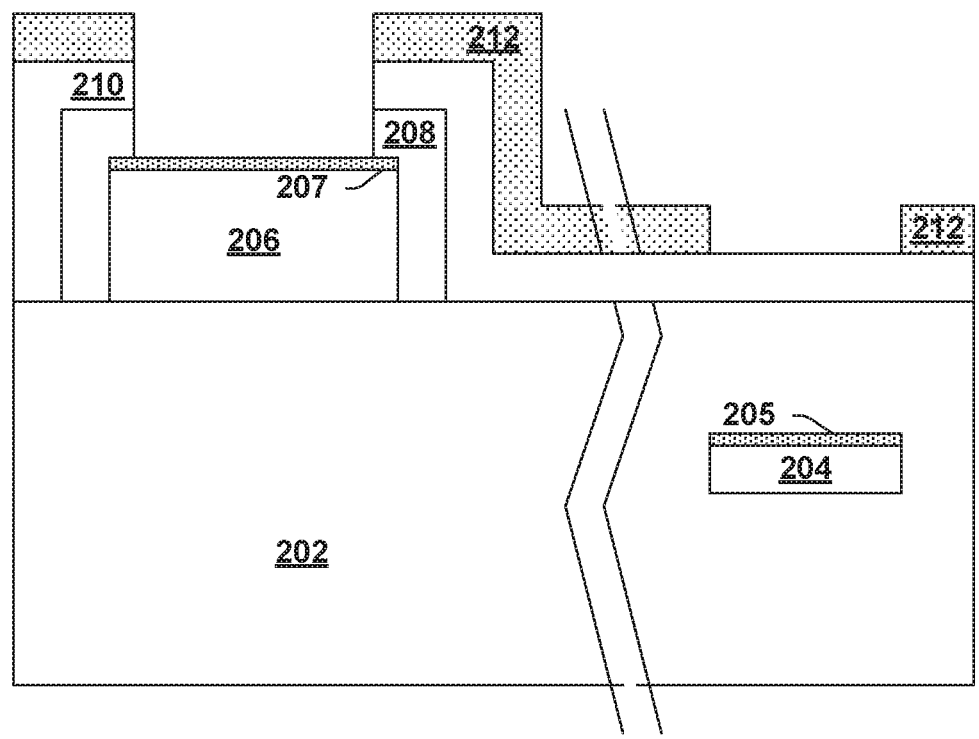
FIG. 2C is another cross sectional view of the semiconductor device at a stage of fabrication to illustrate bond pad exposure and fuse window formation.

FIG. 2C is another cross sectional view of the semiconductor device 200 at a stage of fabrication to illustrate bond pad exposure and fuse window formation. A selective etching process is performed that selectively removes a portion of the oxide layer 202 and the passivation layer 210 above the fuse layer 204 and a portion of the deposited oxide layer 208 and the passivation layer 210 above or over the bond pad 206. An amount or thickness of the oxide layer 202 remains over the fuse layer and is referred to as the fuse window. The coating 207 prevents etching of the bond pad 206 by having a material that is not readily etched via the selective etching process. In one example, the coating 207 is etched at a substantially slower rate than the oxide layer 202. In another example, the coating 207 is not substantially etched by the selective etching process.

Figure 2D:
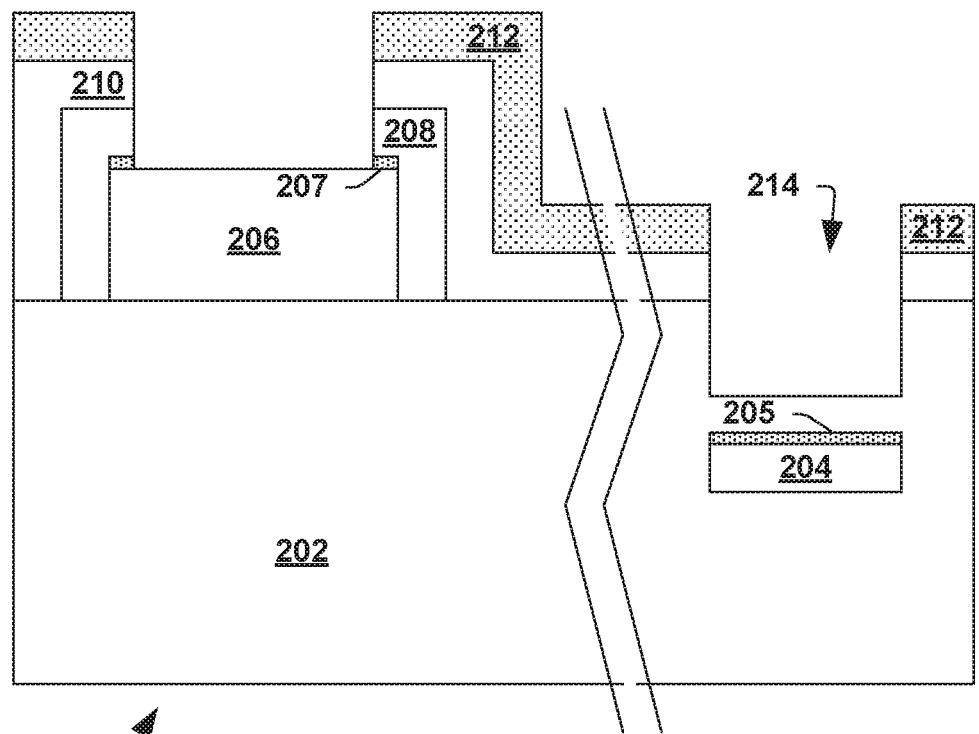
FIG. 2D is yet another cross sectional view of the semiconductor device at a stage of fabrication to illustrate bond pad exposure and fuse window formation.

FIG. 2D is yet another cross sectional view of the semiconductor device 200 at a stage of fabrication to illustrate bond pad exposure and fuse window formation. Before removal of the photoresist layer 212, a plasma etching process is used to remove the coating 207. This exposes an upper surface of the bond pad 206. However, the plasma etch undesirably removes a portion 214 of the oxide layer 202 above the fuse layer 204. Fuse performance is degraded or altered by the removed portion 214. Subsequently, the photoresist layer 212 is also removed or stripped.

Figure 2E:
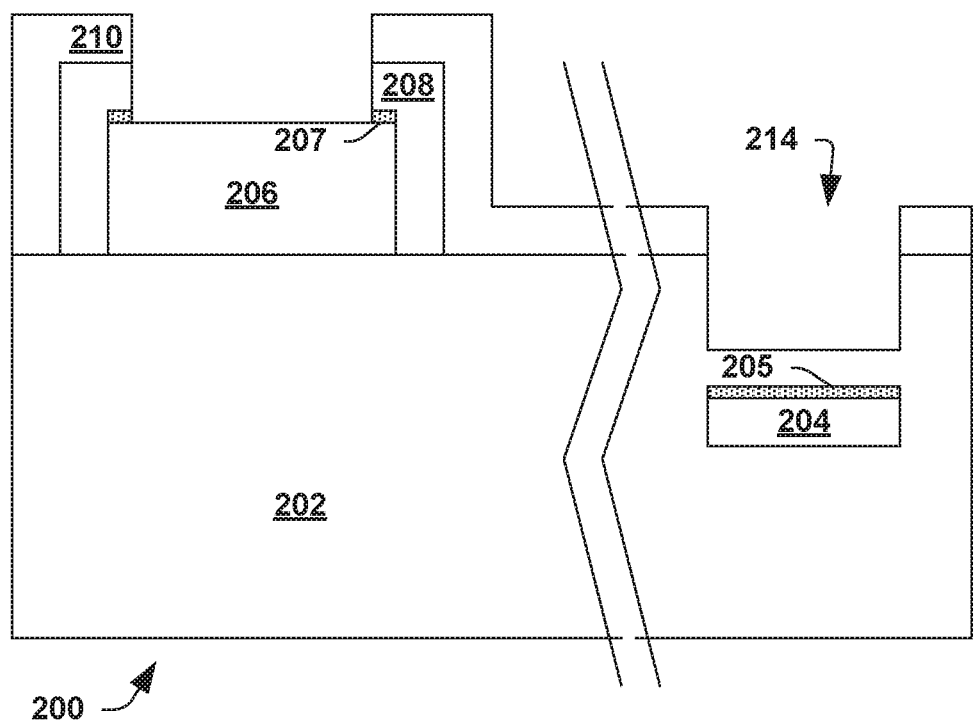
FIG. 2E is yet another cross sectional view of the semiconductor device at a stage of fabrication to illustrate bond pad exposure and fuse window formation.

FIG. 2E is yet another cross sectional view of the semiconductor device 200 at a stage of fabrication to illustrate bond pad 206 exposure and fuse window formation. Here, the passivation layer 210 is removed.

The device 200 is fabricated with the fuse window and an exposed upper layer of the bond pad 206. The device 200 was fabricated using a single mask to create the fuse window and the exposed upper layer of the bond pad. However, a separate plasma etch processing step is required to expose the upper layer of the bond pad 206. This extra step also results in the portion 214 of the oxide layer 202 to be removed. Additionally, portions of the coating 207 remain and are referred to as coating residue. Further, the plasma etch can leave remnant materials, such as fluorine, on the bond pad 206 afterward. Other formation processes, including device packaging, connection of leads, and the like can also be performed.

Figure 3:
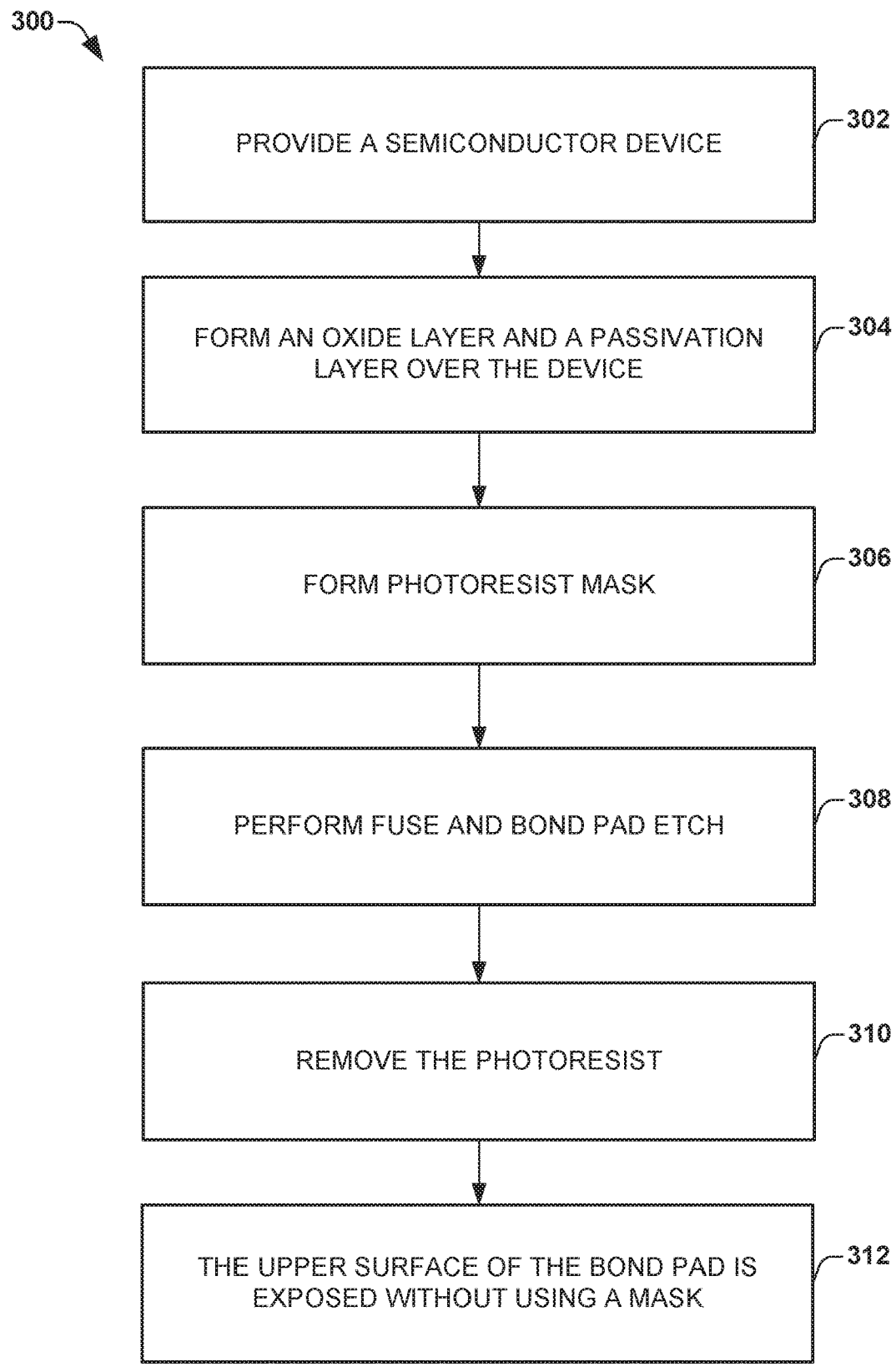
FIG. 3 is a flow diagram illustrating a method of fabricating a semiconductor device 400 having a fuse window and an exposed upper surface of a bond pad in accordance with some embodiments.

FIG. 3 is a flow diagram illustrating a method 300 of fabricating a semiconductor device 400 having a fuse window and an exposed upper surface of a bond pad in accordance with some embodiments. FIGS. 4A to 4E depict a semiconductor device at various blocks of the method 300. The method 300 is described with reference to FIGS. 4A to 4E in order to facilitate an understanding of the disclosure. It is appreciated that variations in the method 300 and in FIGS. 4A to 4E are contemplated.

Figure 4A:
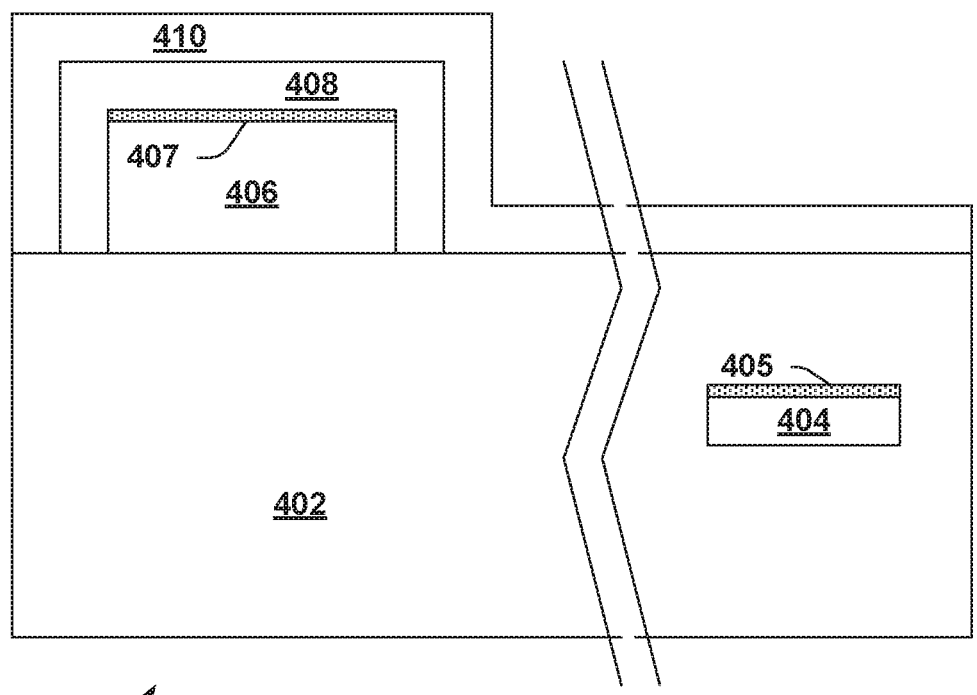
FIG. 4A is a cross sectional view of a semiconductor device at a first stage of fabrication in accordance with some embodiments.

FIG. 4A is a cross sectional view of a semiconductor device 400 at a first stage of fabrication in accordance with some embodiments. The method 300 begins at block 302, wherein the semiconductor device 400 is provided. The semiconductor device 400 includes an oxide layer 402, a bond pad 406, and a fuse layer 404. The bond pad 406 is located about or over the oxide layer 402. The fuse layer 404 is positioned within and is surrounded by the oxide layer 402.

In this example, the oxide layer 402 is comprised of silicon-dioxide ("oxide"). However, it is appreciated that alternative dielectric materials can be used for the oxide layer 402. The bond pad 406 is comprised of a suitable conductive material, such as Al—Cu, Al—Si—Cu, metal, and the like. The bond pad 406 can be utilized to electrically connect devices and circuits (not shown) within the device 400. For example, wires can be connected to the bond pad 406 and a package lead and provide an external connection to the device 400. The fuse layer 404 is also comprised of a suitable conductive material. The fuse layer 404 is coupled with an amount of a dielectric material to form a fuse. The fuse layer 404 is utilized to prevent or mitigate damage due to over current conditions and/or short circuit conditions. The fuse layer 404, thus, limits an amount of current or energy that can pass through thereby mitigating damage to circuits and components.

An anti reflective coating (ARC) 407 is formed on an upper surface of the bond pad 406. In one example, the ARC 407 is comprised of Titanium-Nitride. However, it is appreciated that alternate coatings can be utilized. Similarly, the fuse layer 404 also includes another anti reflective coating (ARC) 405 formed on an upper surface of the fuse layer 404. Alternate coatings can be used. Additionally, it is appreciated that the materials used for the coatings 405 and 407 can vary from each other.

The semiconductor device 400 requires removal of oxide and coatings from the bond pad 406 while maintaining a thickness of oxide above the fuse layer 404. The remaining thickness above the fuse layer 404 is also referred to as a fuse window.

An oxide layer 408 and a passivation layer 410 are formed over the device 400 at block 304. The oxide layer 408 is formed by a suitable process, such as an oxide deposition process. The oxide layer 408 if formed to have a selected thickness. In this example, the oxide layer 408 is comprised of oxide, however it is appreciated that other dielectric materials can be used instead of oxide. The passivation layer 410 is formed on or over the oxide layer 408. The passivation layer 410 is deposited by a suitable deposition process and is comprised of a suitable material. In one example, the passivation layer 410 is comprised of nitride, such as Titanium-Nitride.

Figure 4B:
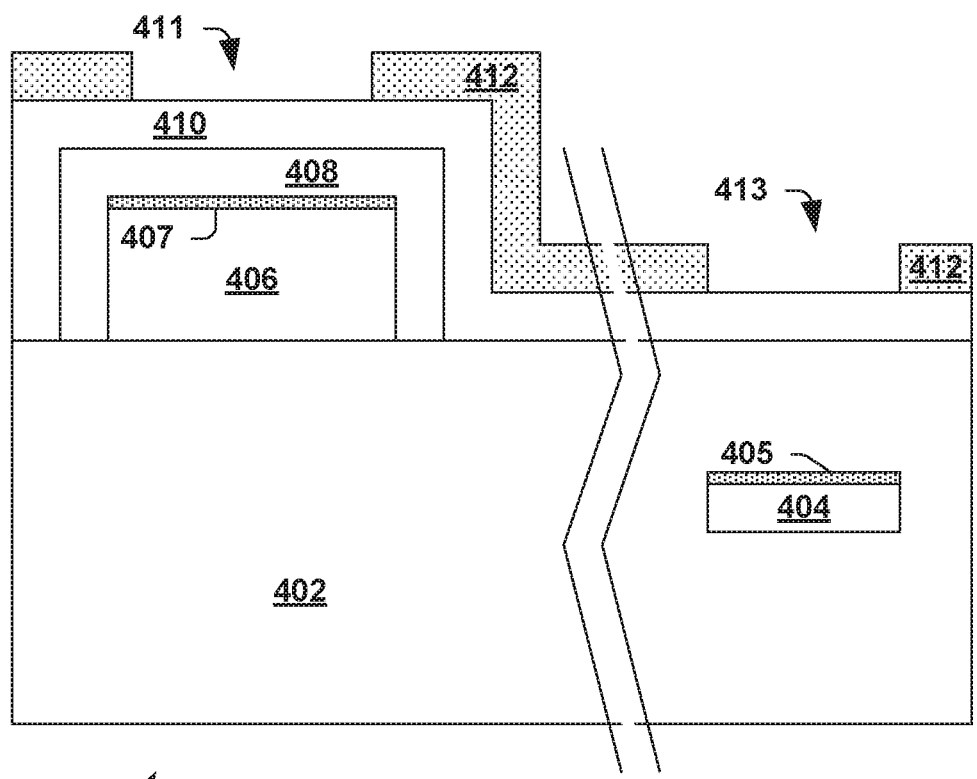
FIG. 4B is a cross sectional view of the semiconductor device at another stage of fabrication.

FIG. 4B is a cross sectional view of the semiconductor device 400 at another stage of fabrication. A photoresist mask is formed over the device 400 at block 306. A layer of photoresist 412 is formed over the device 400. The photoresist layer 412 is comprised of a light sensitive chemical. A suitable formation or coating process is utilized. In one example, the photoresist 412 is formed by dispensing the material onto the device 400 and then spinning the device 400 to form a uniform layer.

The layer of photoresist 412 is exposed to form a bond pad opening 411 and a fuse opening 413 in the layer of photoresist 412. The layer of photoresist 412 is exposed to a pattern of light such that portions of the layer 412 are exposed and other portions are not exposed. This is also referred to as developing. The exposure selects portions to be removed, for example, by a developer solution or other removal process. The selected portions are removed and form the bond pad opening 411 and the fuse opening 413. The remaining portions of the layer of photoresist 412 form the photoresist mask or resist mask.

Figure 4C:
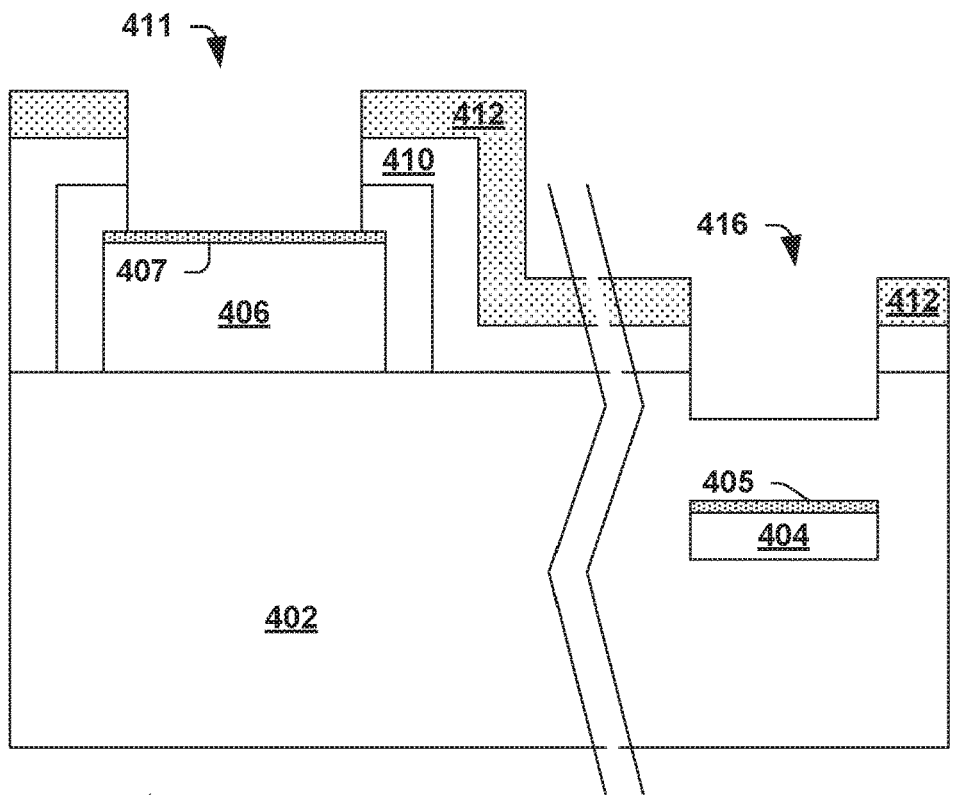
FIG. 4C is another cross sectional view of the semiconductor device at a stage of fabrication in accordance with some embodiments.

FIG. 4C is another cross sectional view of the semiconductor device 400 at a stage of fabrication in accordance with some embodiments. A fuse and bond pad passivation etch process is performed at block 308. The etch uses the photoresist mask formed from the layer of photoresist 412. The etch process simultaneously removes exposed portions of the oxide layers 408 and 402 and the passivation layer 410. The exposed portions are defined by the bond pad opening 411 and the fuse opening 413. A remaining portion of the oxide layer 402 above the fuse layer 404 is defined as a fuse window 416. The ARC 407 prevents etching of the bond pad 406 by having a material that is not readily etched via the etching process. In one example, the ARC 407 is etched at a substantially slower rate than the oxide layer 402. In another example, the ARC 407 is not substantially etched by the fuse and passivation etching process.

After completion of the passivation fuse etching process, the layer of photoresist 412 is removed at block 310. In one example, the layer 412 is removed by a suitable process, such as stripping or ashing.

Figure 4D:
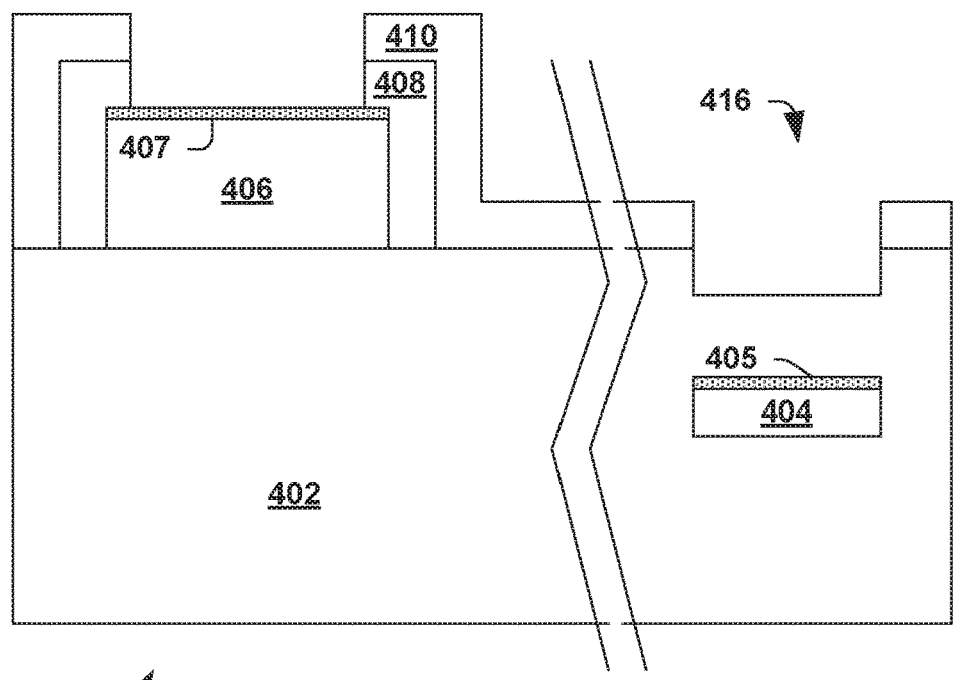
FIG. 4D is yet another cross sectional view of the semiconductor device at a stage of fabrication in accordance with some embodiments.

FIG. 4D is yet another cross sectional view of the semiconductor device 400 at a stage of fabrication in accordance with some embodiments. The fuse window 416 is formed, however the bond pad 406 is not yet exposed. This is because the ARC 407 remains on the upper surface of the bond pad 406. A mask-less bond pad "etch" or removal is performed to expose the upper surface of the bond pad 406 at block 312. The bond pad etch is performed without a resist mask and with a suitable solution or reagent that substantially removes the ARC 407, but does not substantially remove portions of the passivation layer 410 or portions of the fuse window 416. One example of a suitable solution includes hydrogen peroxide, which is used to remove the ARC 407, when comprised of TiN. It is appreciated that other suitable solutions are also be utilized. As a result, the upper surface of the bond pad 406 is exposed.

Figure 4E:
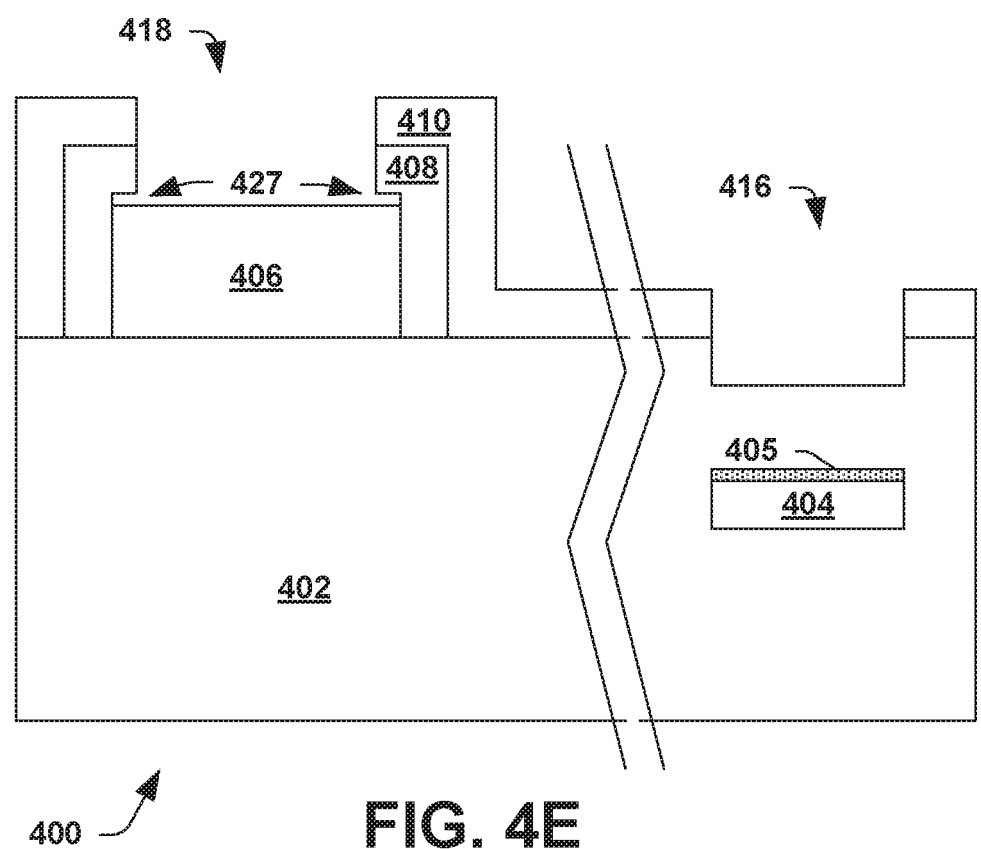
FIG. 4E is another cross sectional view of the semiconductor device at a stage of fabrication in accordance with some embodiments.

FIG. 4E is another cross sectional view of the semiconductor device 400 at a stage of fabrication in accordance with some embodiments. This view shows that the upper surface 418 of the bond pad 406 is exposed and that the fuse window 416 has been created. The solution used is a highly selective reagent that substantially removes the ARC 407 without any or substantially any loss of dielectric material over the fuse layer 404. Thus, even portions under the oxide layer 408 as shown at 427 are removed and no coating residue remains. As a result, the method 300 provides the exposed upper surface 418 of the bond pad 406 and the fuse window 416 with less processing steps, a reduced number of photolithography steps, and/or at a lower cost than conventional semiconductor fabrication techniques.

It is noted that the device 400 is fabricated by the method 300 using one mask to define the fuse window 416 and the bond pad area at the same time. The ARC 407 is selected to stop etching over the bond pad 406 while etching the fuse window 416. Further, the use of a plasma etch process to expose the bond pad 406 is avoided, which also prevents remnants from plasma etch processes from being left on the bond pad 406.

Typically, other processes are subsequently performed on the device 400. In one example, additional structures and devices are performed. In another example, bond wires are attached to the bond pad and a package lead to provide an external connection to the device 400.

It will be appreciated that while reference is made throughout this document to exemplary structures in discussing aspects of methodologies described herein (e.g., the structure presented in FIGS. 4A to 4E, while discussing the methodology set forth in FIG. 3), that those methodologies are not to be limited by the corresponding structures presented. Rather, the methodologies (and structures) are to be considered independent of one another and able to stand alone and be practiced without regard to any of the particular aspects depicted in the FIGS.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

The present disclosure includes a semiconductor device. A fuse layer is arranged within a first dielectric layer. A bond pad is arranged on the first dielectric layer. A second dielectric layer is arranged along sidewall and upper surfaces of the bond pad. A passivation layer is arranged over the first and second dielectric layers, and the passivation layer having a bond pad opening overlying the bond pad and a fuse opening overlying the fuse layer. The bond pad has a bottom surface that is co-planar with a bottom surface of the passivation layer.

The present disclosure also includes another semiconductor device. A fuse layer is arranged within a first dielectric layer. A bond pad is arranged on the first dielectric layer. A second dielectric layer includes a vertical portion along sidewalls of the bond pad that is coupled to a lateral portion along an upper surface of the bond pad. A passivation layer is arranged over the first and second dielectric layers. The passivation layer has a bond pad opening overlying the bond pad and a fuse opening overlying the fuse layer. The second dielectric layer is laterally separated apart from the fuse opening by the passivation layer.

The present disclosure also includes another semiconductor device. The device includes a fuse layer arranged within a first dielectric layer. A bond pad is arranged on the first dielectric layer. A second dielectric layer is over the bond pad and fuse layer. The second dielectric layer overlies outer edges of the bond pad. A passivation layer is arranged over the fuse layer and the bond pad. The second dielectric layer is formed along sidewall and upper surfaces of the bond pad, and does not overlie the fuse layer prior to performing an etch to remove a portion of the second dielectric layer to form a bond pad opening over the bond pad and to thin a portion of the first dielectric layer to form a fuse opening over the fuse layer.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A semiconductor device comprising:
   a fuse layer arranged within a first dielectric layer;
   a bond pad arranged on the first dielectric layer;
   a second dielectric layer arranged along a sidewall and an upper surface of the bond pad;
   a passivation layer arranged over the first and second dielectric layers, and the passivation layer having a bond pad opening overlying the bond pad and a fuse opening overlying the fuse layer;
   wherein the bond pad has a bottommost surface that is co-planar with a bottommost surface of the passivation layer;
   wherein the second dielectric layer extends between an innermost sidewall and an outermost sidewall, wherein the innermost sidewall faces the bond pad opening and the outermost sidewall faces the passivation layer, wherein the innermost sidewall is coupled to the outermost sidewall by a single continuous planar top surface of the second dielectric layer; and wherein the passivation layer has a first sidewall that is coupled between a topmost surface of the passivation layer that is directly over the bond pad and a single continuous planar upper surface of the passivation layer that is further coupled to a second sidewall of the passivation layer defining the fuse opening.

2. The device of claim 1, further comprising:

an anti reflective coating arranged on an upper surface of the fuse layer, wherein the anti reflective coating has a first width that is approximately equal to a second width of the fuse opening.

3. The device of claim 2, wherein the anti reflective coating comprises titanium nitride.

4. The device of claim 1, wherein a bottommost surface of the second dielectric layer is co-planar with the bottommost surface of the passivation layer.

5. The device of claim 4, wherein the bottommost surface of the second dielectric layer and the bottommost surface of the passivation layer contact a same upper surface of the first dielectric layer.

6. The device of claim 1, further comprising:

a masking layer disposed on the passivation layer and having sidewalls that are aligned along a line with both the second sidewall of the passivation layer and a sidewall of the first dielectric layer that further defines the fuse opening.

7. The device of claim 1, wherein a topmost surface of the bond pad is separated from a lower surface of the second dielectric layer that faces the topmost surface of the bond pad by an air-gap, the air-gap being directly between the lower surface of the second dielectric layer and the topmost surface of the bond pad.

8. The device of claim 1, wherein the fuse opening is defined by both a sidewall of the first dielectric layer and the second sidewall of the passivation layer, the sidewall of the first dielectric layer and the second sidewall of the passivation layer aligned along a vertically extending line.

9. The device of claim 1, wherein a lateral portion of the second dielectric layer has an opening aligned with the bond pad opening.

10. The device of claim 1, further comprising:

an anti reflective coating completely covering a top surface of the bond pad, wherein a horizontal line extending along a top surface of the anti reflective coating intersects a sidewall of a mask layer over the passivation layer, the horizontal line parallel to the top surface of the bond pad.

11. The device of claim 1, wherein the bottommost surfaces of the passivation layer and the bond pad vertically contact the first dielectric layer.

* * * * *